US 6,744,112 B2

(12) United States Patent
Johnson et al.

(10) Patent No.: US 6,744,112 B2
(45) Date of Patent: Jun. 1, 2004

(54) MULTIPLE CHIP GUARD RINGS FOR INTEGRATED CIRCUIT AND CHIP GUARD RING INTERCONNECT

(75) Inventors: Jeffrey B. Johnson, Essex Junction, VT (US); Alvin J. Joseph, Williston, VT (US); Parker A. Robinson, Largo, FL (US); Raminderpal Singh, Essex Junction, VT (US); Dennis Whittaker, Tampa, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/261,819

(22) Filed: Oct. 1, 2002

(65) Prior Publication Data

US 2004/0061183 A1 Apr. 1, 2004

(51) Int. Cl.[7] ............................................. H01L 23/58
(52) U.S. Cl. .................. 257/491; 257/495; 257/496
(58) Field of Search .............................. 257/483, 484, 257/127, 129, 170, 171, 401, 487, 488, 490, 491, 495, 496

(56) References Cited

U.S. PATENT DOCUMENTS

| 4,223,334 A | 9/1980 | Gasner et al. |
| 4,574,467 A | 3/1986 | Halfacre et al. |
| 5,045,913 A | 9/1991 | Masleid et al. |
| 5,049,953 A | 9/1991 | Mihara et al. |
| 5,231,300 A | 7/1993 | Terashima et al. |
| 5,301,084 A | 4/1994 | Miller |
| 5,317,183 A | 5/1994 | Hoffman et al. |
| 5,637,900 A | 6/1997 | Ker et al. |
| 5,736,774 A * | 4/1998 | Fujihira ..................... 257/500 |
| 5,801,407 A | 9/1998 | Yamada |
| 5,828,110 A | 10/1998 | Wollesen |
| 5,864,168 A | 1/1999 | Nasserbakht |
| 6,274,909 B1 | 8/2001 | Chang et al. |
| 6,563,181 B1 * | 5/2003 | Du et al. ..................... 257/394 |
| 2001/0028096 A1 | 10/2001 | Ohguro et al. |

FOREIGN PATENT DOCUMENTS

| JP | 2000-49286 | 2/2000 |
| WO | WO98/12750 | 3/1998 |

* cited by examiner

Primary Examiner—Ngân V. Ngô
(74) Attorney, Agent, or Firm—Spencer K. Warnick; Hoffman, Warnick & D'Alessandro LLC (57) ABSTRACT

An integrated circuit having structure for isolating circuit sections having at least one differing characteristic. The structure includes a chip guard ring for each circuit section having the at least one differing characteristic. Providing multiple chip guard rings allows for isolation of circuit sections and prevention of ionic contamination, but without increased expense and size. In addition, it is practicable with any IC. The invention also may include an interconnect for electrical connectivity about a chip guard ring.

20 Claims, 7 Drawing Sheets

MULTIPLE CHIP GUARD RINGS FOR INTEGRATED CIRCUIT AND CHIP GUARD RING INTERCONNECT

BACKGROUND OF THE INVENTION

1. Technical Field

The present invention relates generally to chip guard rings for integrated circuits and, more particularly, to noise isolation for an integrated circuit using multiple chip guard rings.

2. Related Art

A chip guard ring is a protective metal structure and substrate contact encircling an entire active region of a chip. In some instances, a chip guard ring is referred to as a seal ring. Chip guard rings are provided as barriers to ionic contamination that can penetrate the exposed edges of a diced chip during manufacture, and for mechanical stability.

In conventional integrated circuits (ICs) where multiple circuit sections with differing characteristics are provided, certain sections must be isolated from other sections. Historically, a single chip guard ring is provided about all active circuit sections during manufacture regardless of their differing characteristics. A single chip guard ring, however, does not promote isolation between circuit sections. For example, where mixed digital and analog circuit sections are provided, isolation is required to reduce noise propagation. A single chip guard ring propagates noise readily from one section to another. In larger ICs (e.g., SoC type), the noise travels easily and causes many unwanted and unmanageable noise coupling situations. This situation is especially troublesome in wire bond ICs where floor planning with respect to the bond pads is restricted for radio frequency (RF) designs. Another example of where isolation is required is where different circuit voltage domains are used between sections. Again, a single chip guard ring hinders isolation between these sections.

One remedy that has been implemented relative to isolating different characteristic circuit sections is spacing the sections farther apart within the single chip guard ring. This solution, however, generates a number of unsatisfactory results. In particular, it increases space requirements, which is always a detriment to overall IC compactness; increases cost by reducing the number of chips per wafer; and is not always usable in wirebond ICs. Other remedies such as providing numerous grounds have also been proposed, but none adequately isolate or minimize the above-described side effects.

In view of the foregoing, there is a need in the art to overcome the lack of isolation for circuit sections having differing characteristics created by the use of a single chip guard ring.

BRIEF SUMMARY OF THE INVENTION

The invention includes an integrated circuit having structure for isolating circuit sections having differing characteristics, e.g., a mixed analog and digital technology using multiple chip guard rings. The structure includes a chip guard ring for each circuit section having at least one different characteristic. Providing multiple chip guard rings isolates the circuit sections having different characteristics and provides the necessary barrier to ionic contamination, but without increased expense and size. In addition, it is practicable with any IC. The invention also includes at least one interconnect about a chip guard ring to accommodate electrical connection to a circuit section therein.

A first aspect of the invention is directed to a structure for isolating circuit sections of an integrated circuit, the circuit sections each having at least one differing characteristic, the structure comprising: a chip guard ring for each circuit section having the at least one differing characteristic.

A second aspect of the invention is directed to an integrated circuit comprising: a first circuit section; a second circuit section having at least one different characteristic than the first circuit section; a first chip guard ring surrounding the first circuit section; and a second chip guard ring surrounding the second circuit section.

A third aspect of the invention is directed to a structure for an integrated circuit having a chip guard ring, the structure comprising: at least one interconnect for electrical connectivity about the chip guard ring.

The foregoing and other features of the invention will be apparent from the following more particular description of embodiments of the invention.

BRIEF DESCRIPTION OF THE SEVERAL VIEWS OF THE DRAWINGS

The embodiments of this invention will be described in detail, with reference to the following figures, wherein like designations denote like elements, and wherein.

DETAILED DESCRIPTION OF THE INVENTION

Figure 1:
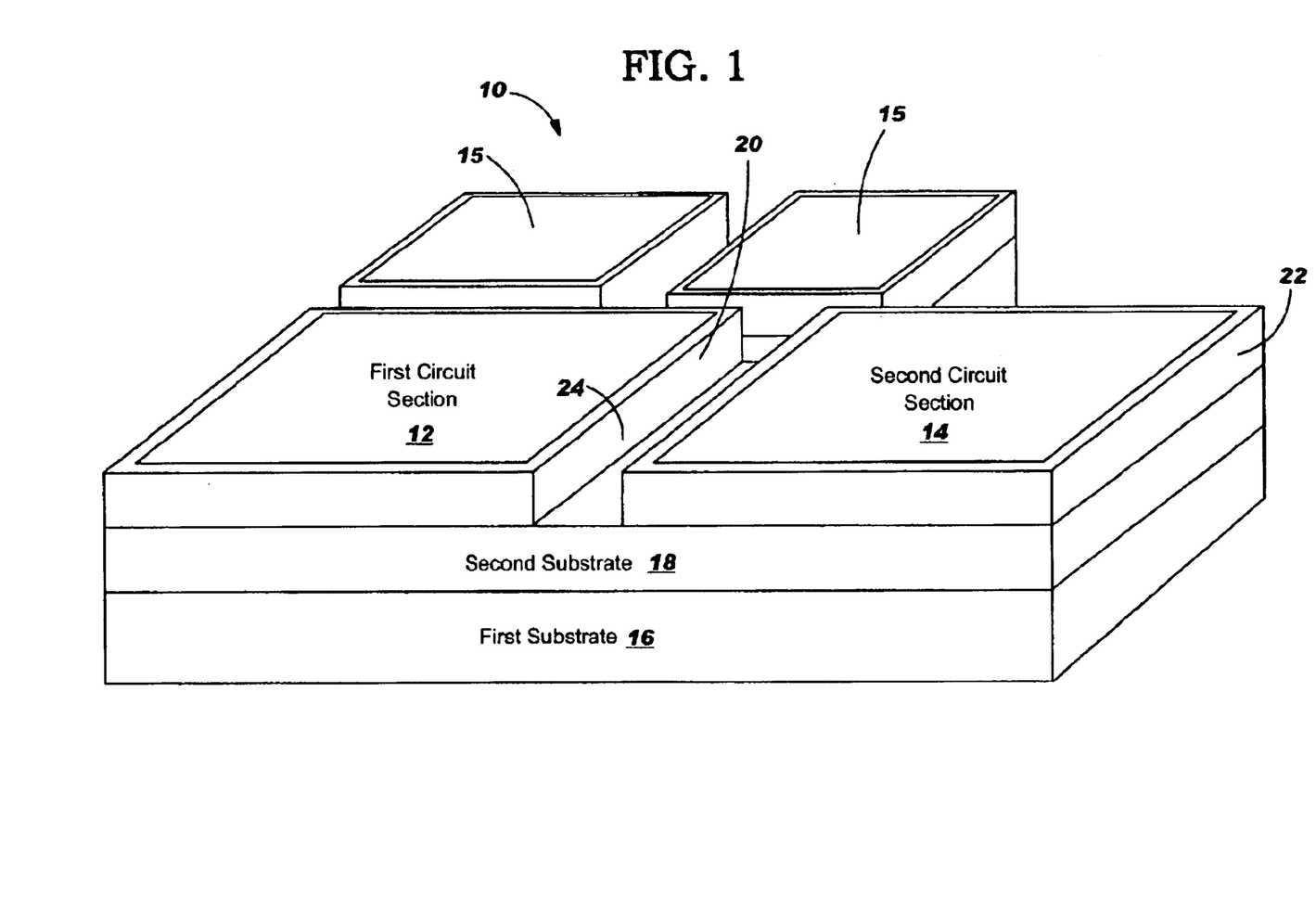
FIG. 1 shows a perspective view of an integrated circuit having multiple chip guard rings.

With reference to the accompanying drawings, FIG. 1 shows a perspective view of an integrated circuit (IC) 10 having a first circuit section 12 and a second circuit section 14 positioned upon a first substrate 16 and a second substrate 18. Relative to substrates 16, 18, it should be recognized, that second substrate 18 can also be provided as a continuation of first substrate 16, and the polarity of second substrate 18 determined by an appropriate dopant. Other circuit sections 15 are also shown. However, for clarity only sections 12 and 14 will be described in detail. Each circuit section includes at least one different characteristic compared to the other circuit sections. A "different characteristic" can be any now known or later developed disparity between the circuit sections, e.g., voltage, type (digital or analog), different clocks, etc. Each circuit section is surrounded by a chip guard ring: first circuit section 12 is surrounded by a chip guard ring 20, and second circuit section 14 is surrounded by a chip guard ring 22. Each chip guard ring 20, 22 is grounded. For purposes of this disclosure, a "chip guard ring" shall mean a protective structure and substrate contacting member encircling an active circuit section of integrated circuit 10. The purposes, inter alia, of chip guard ring 20, 22 is to provide a barrier to ionic contamination of sections 12, 14 during manufacture. A "chip guard ring," as used herein, should not be confused with other types of "circuit" guard rings provided to prevent noise propagation.

It should be recognized that while each circuit section has at least one different characteristic, each circuit section may also have different characteristic circuits within its boundaries. Further, it should be recognized that the teachings of the invention are applicable to any number of circuit sections 12, 14, 15 of an Integrated circuit 10.

Figure 2:
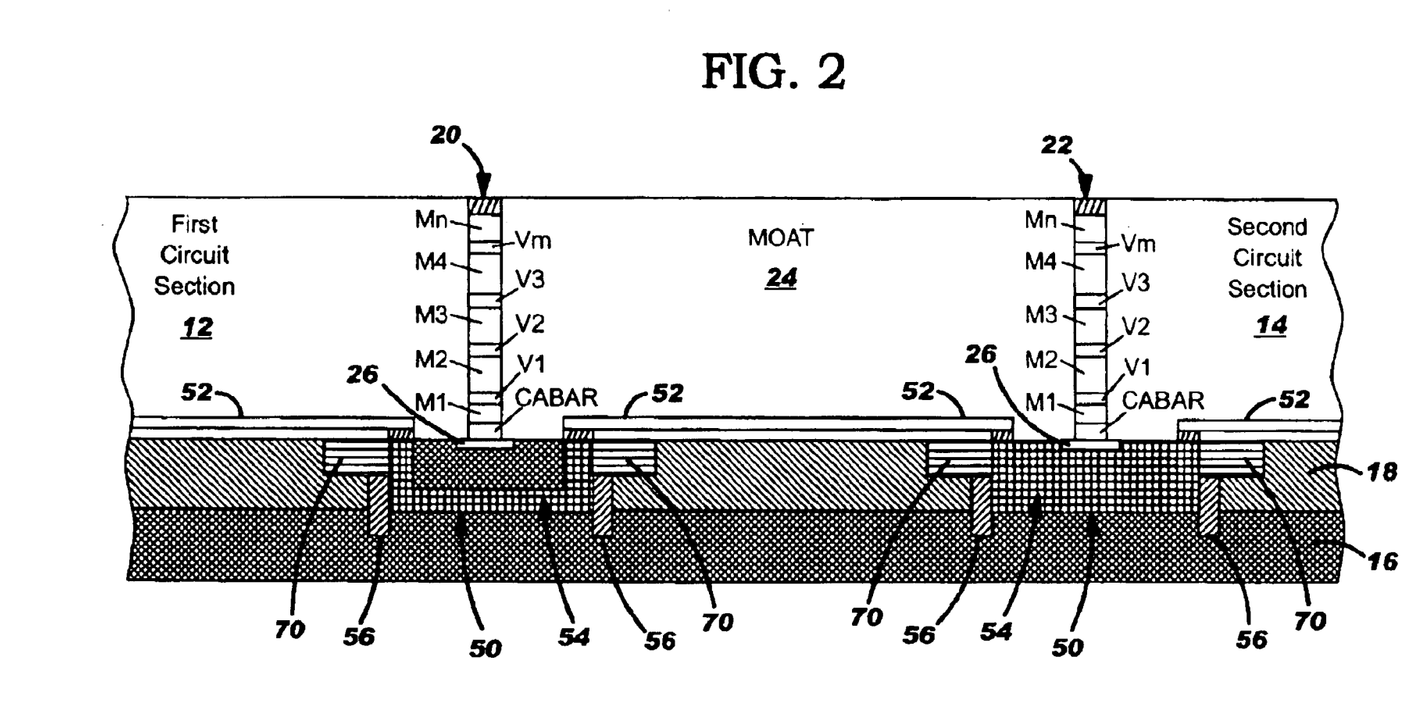
FIG. 2 shows a cross-sectional view of the IC of FIG. 1 including a pair of interconnects.

Referring to FIG. 2, a chip guard ring 20, 22 may be made of a number of vertically stacked metal layers M1–Mn (where n is an Integer) with metal V1–Vm (where m is an integer), e.g., of tungsten, providing connection between the metal layers. A lower one of the via layers may be referred to as a CABAR via layer. It should be recognized, however, that the structure of a chip guard ring 20, 22 is not specific to the invention and that any now known or later developed chip guard ring structure is considered within the scope of this invention.

With continuing reference to FIGS. 1 and 2, an area of separation 24, sometimes referred to as a "moat," is positioned between first circuit section 12 and second circuit section 14 and their respective chip guard rings 20, 22 for further prevention of noise propagation.

Referring to FIG. 2, the invention may also includes at least one interconnect 50 for electrical connectivity about a respective chip guard ring 20, 22. Each chip guard ring 20, 22 is provided with a base 26, which will be described in greater detail below.

As shown in FIG. 2, a pair of interconnects 50 may be used to electrically connect first circuit section 12 and second circuit section 14. If additional connectivity is required, a number of pairs of interconnects can be used between circuitry sections 12, 14. In this case, further pairs of interconnects would be provided adjacent one another (into or out of the page of FIG. 2) between sections 12, 14. FIG. 3B shows a plan view of an embodiment where two pairs of interconnects are illustrated. Of course, the more pairs of interconnects 50 that are used, the more potential for noise propagation. Each design, therefore, will have its own particular limit on the number of pairs of interconnects available.

With continuing reference to FIG. 2, each interconnect 50 includes a lead portion 52 positioned to either side of its respective chip guard ring 20, 22 and a connection portion 54. Lead portions 52 may be referred to as signal "jumpers."

FIGS. 3A, 4A, 5A, 6A and 7A show perspective views of five embodiments of connection portions of an interconnect 50; and FIGS. 3B, 4B, 5B, 6B and 78 show corresponding plan views of those embodiments. For clarity, these figures only show one of the sections 12, 14, a respective one of their chip guard rings 20, 22, and, in most cases, a respective one interconnect 50. In one exemplary embodiment, first substrate 16 is a P– type material, and second substrate 18 as an epitaxial N– type material. A common feature of the embodiments Is that the interconnect(s) 50 (in particular, the connection portion(s)) is of one type material and is separated from the chip guard ring 20, 22 by a base 26 of the opposite type and from the second substrate 18 via a deep trench 56 to either side. A silicon trench isolation 70 may also be provided above deep trench 56 and second substrate 18. However, deep trench(es) 56 and epitaxy may not be necessary, e.g., where first and second substrates 16, 18 are of the same type or a single layer. For purposes of description of the embodiments shown, isolation between components is provided by different type doped material in which the 'first type' is a P type and the 'second type' is an N type dopant. It should be recognized that the types of materials of the substrates and the components of the connection portions 54, and their respective concentrations, may be altered so long as the impedance functionality, as described below, is sustained.

Figure 3A:
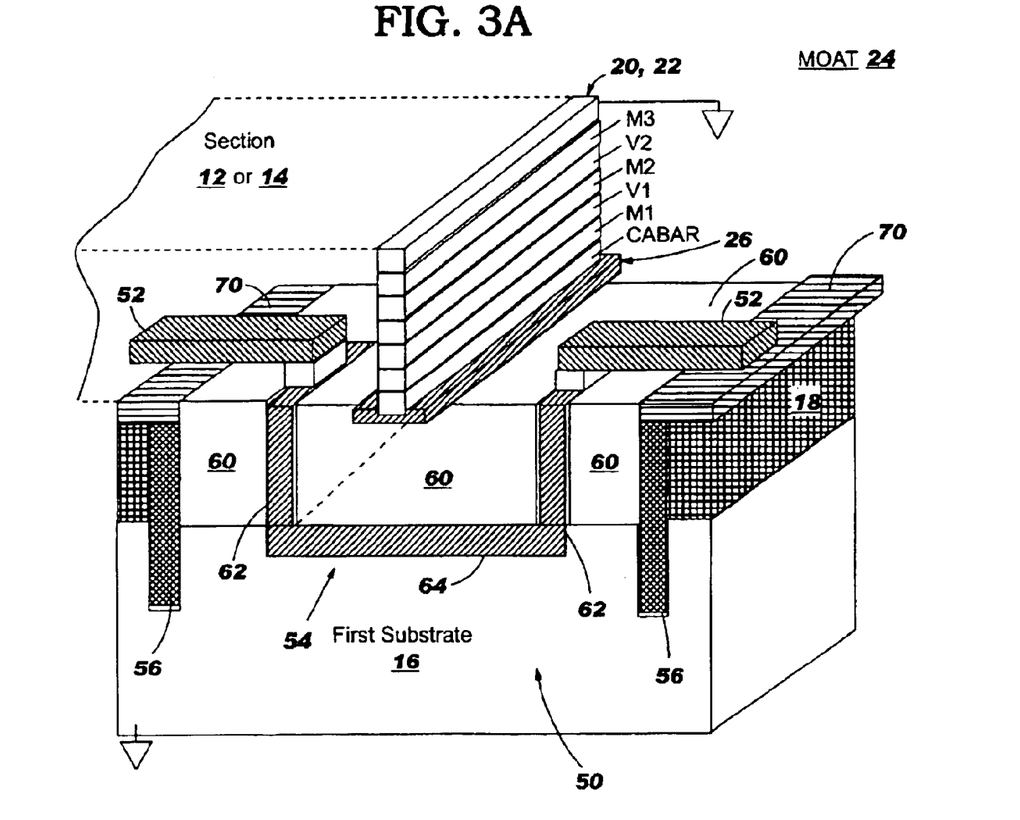
FIG. 3A shows a perspective view of a first embodiment of an interconnect for a guard ring.
Figure 3B:
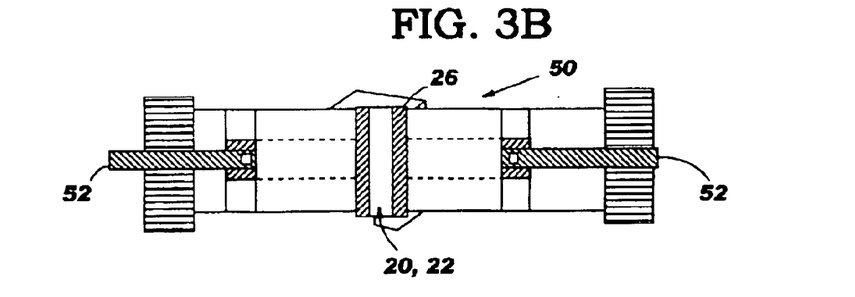
FIG. 3B shows a plan view of the interconnect of FIG. 3A.

With reference to FIGS. 3A and 3B, in a first embodiment, connection portion 54 includes a first type well 60 (e.g., a P type) that is positioned below a second type base 26 (e.g., an N++ type) of chip guard ring 20, 22. As noted above, interconnect 54 and, in particular, the well 60 may be segregated from other structure by a pair of deep trenches 56. If the second substrate 18 is provided as a the same type as the first substrate 16 (i.e., P– as shown), then the deep trenches 56 may be omitted. In this embodiment, connection portion 54 also includes a pair of second type (e.g., N type) reachthroughs 62 extending through first type well 60 and connected by a second type isolation 64, e.g., a buried subcollector, an implanted subcollector, an isolation utilized for isolated field effect transistors (FETs), etc. As shown,first type well 60 surrounds reachthroughs 62. It should be recognized, however, that first type well 60 may be provided only within collection portion 54, i.e., deep trenches may be immediately adjacent reachthroughs 62. Isolation 64 can be provided in first substrate 16 and/or second substrate 18. Current can flow through lead portions 52 and connection portion 54, but is isolated from other structures by first type well 60 and base 26. If more than one interconnect Is required, another one can be provided in first type well 60 at a position separated from the interconnect shown, i.e., further into or out of the page as the figure appears.

Figure 4A:
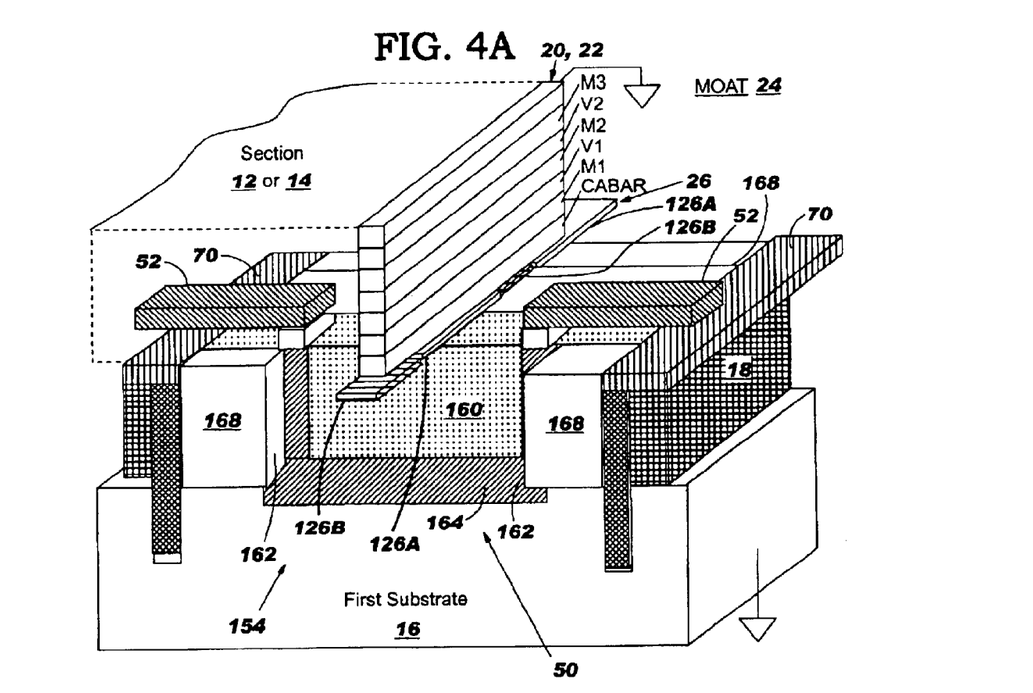
FIG. 4A shows a perspective view of a second embodiment of an interconnect for a guard ring.
Figure 4B:
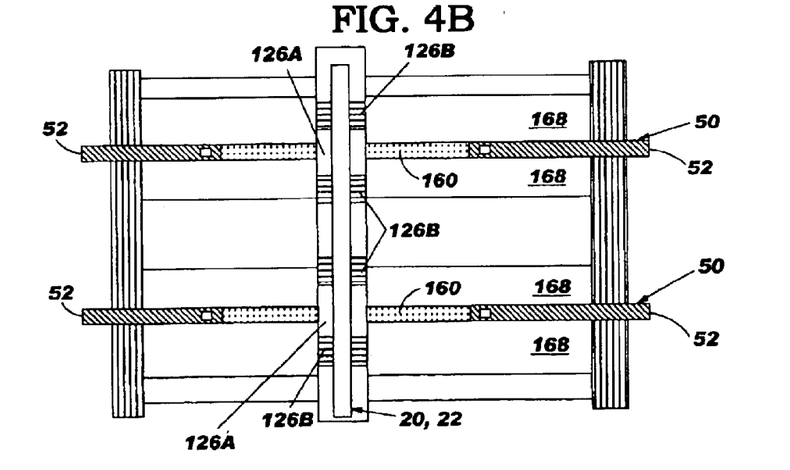
FIG. 4B shows a plan view of the interconnect of FIG. 4A.

FIGS. 4A and 4B illustrate a second embodiment of a connection portion 154. In this embodiment, base 26 of chip guard ring 20, 22 is partitioned to include at least one first type (e.g., P++) base portion 126A and a second type (e.g., N++) base portion 126B to each side of each first type base portion 126A. Connection portion 154 includes a second type (e.g., epitaxial N– type) well 160 below each first type base portion 126A and a pair of second type (e.g., N type) reachthroughs 162 extending through second type well 160 and connected by a second type isolation 164. Second type well 160 of connection portion 154 can be isolated from other connection portions 154 by first type wells 168, and base portions 126A. A first type well 168 is positioned to each side of well 160 and below second type base portions 126B so as to isolate connection portion 154 from other interconnects 50 and chip guard ring 20, 22. With this embodiment, it may be necessary to have first type base portions 126A overlap first type wells 168 to prevent signal shorts.

Figure 5A:
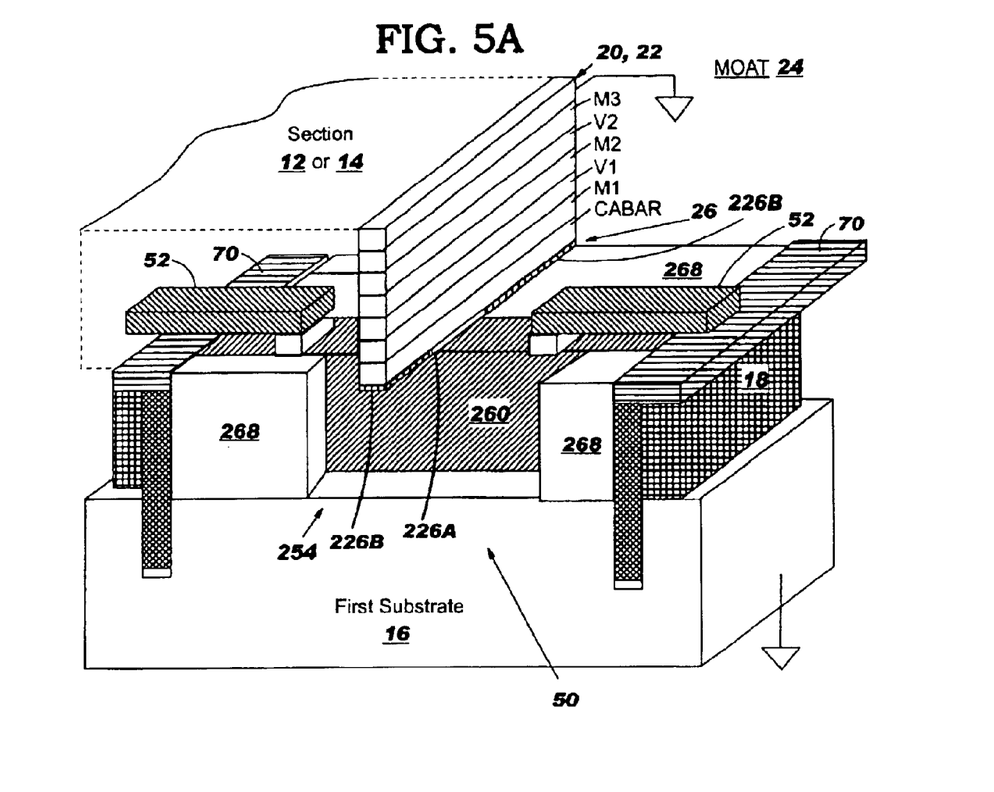
FIG. 5A shows a perspective view of a third embodiment of an interconnect for a guard ring.
Figure 5B:
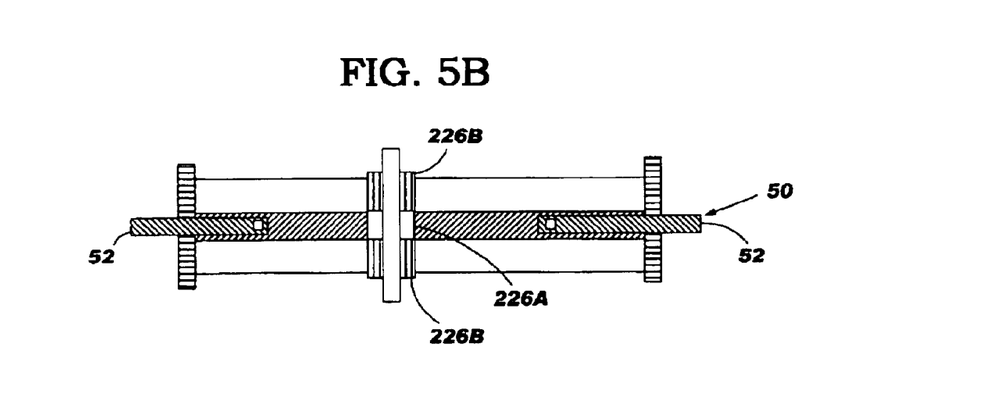
FIG. 5B shows a plan view of the interconnect of FIG. 5A.

FIGS. 5A and 5B illustrate a third embodiment in which chip guard ring 20, 22 includes at least one first type base portion 226A and a second type base portion 2268 to each side of each first type base portion 226A. Connection portion 254 includes a second type well 260 positioned below each first type base portion 226A and between a pair of first type wells 268. In this way, connection portion 254 is isolated from other interconnects 50 and chip guard ring 20, 22. With this embodiment again, it may be necessary to have first type base portions 226A overlap first type wells 268 to prevent signal shorts.

Figure 6A:
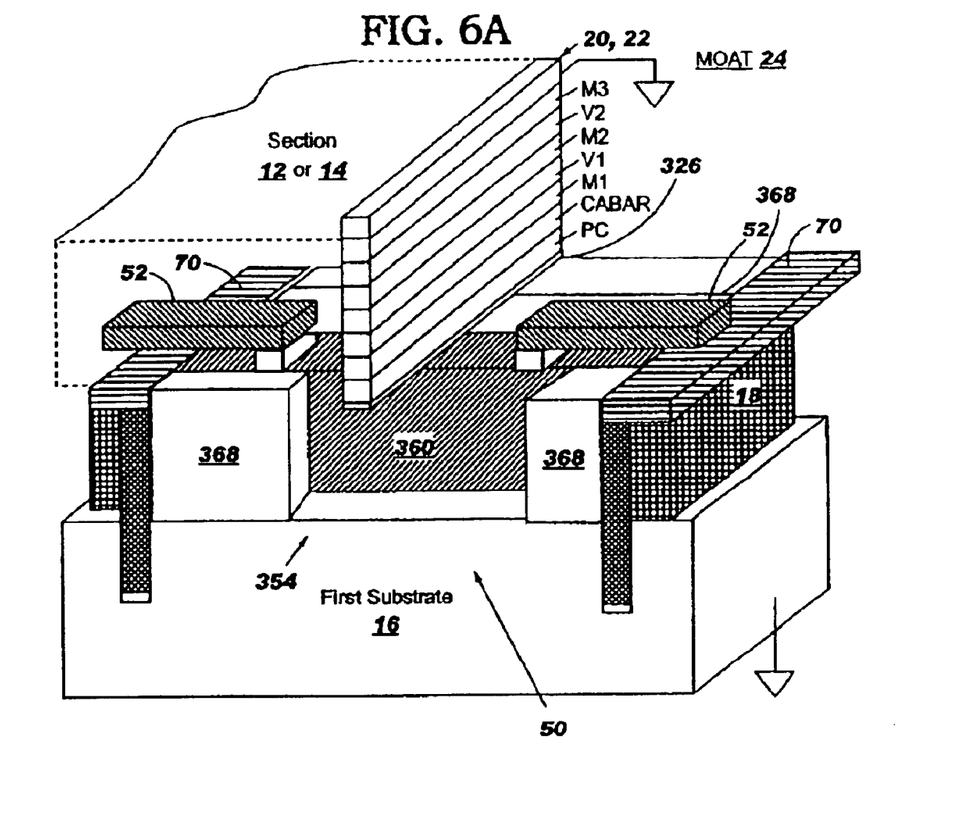
FIG. 6A shows a perspective view of a fourth embodiment of an interconnect for a guard ring.
Figure 6B:
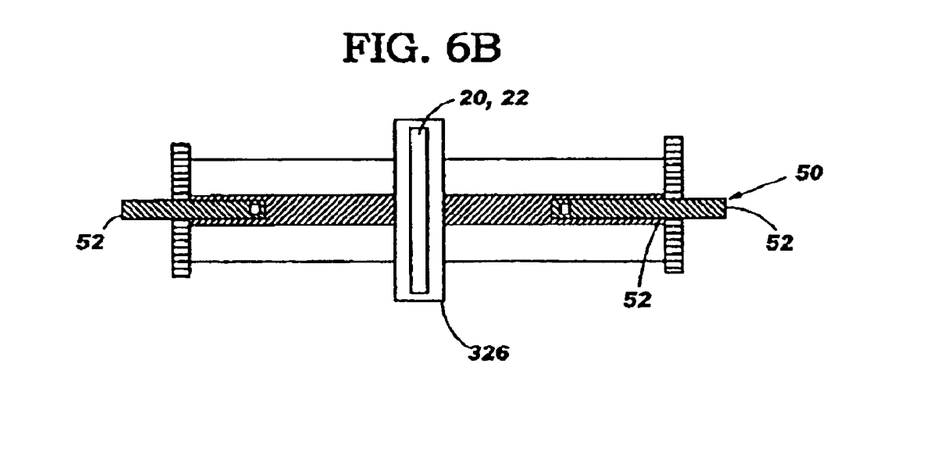
FIG. 6B shows a plan view of the interconnect of FIG. 6A.

FIGS. 6A and 6B illustrate a fourth embodiment in which chip guard ring 20, 22 includes a base 326 made of a gate oxide positioned below a layer of polysilicon PC. Connection portion 354 includes a well 360 of a second type. To each side of connection portion well 360 is a different type well 368, e.g., of a first type, for isolation of interconnects 50. Gate oxide 326 isolates connection portion 354 from chip guard ring 20, 22.

Figure 7A:
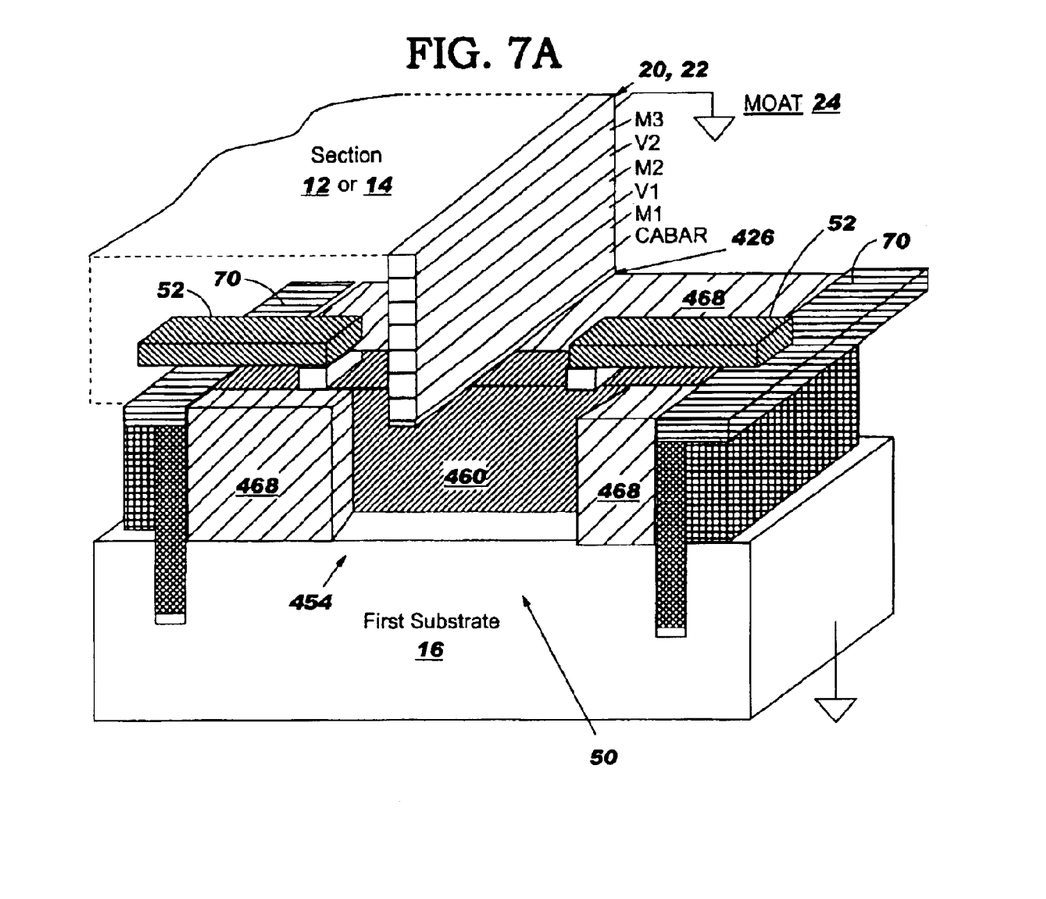
FIG. 7A shows a perspective view of a fifth embodiment of an interconnect for a guard ring.
Figure 7B:
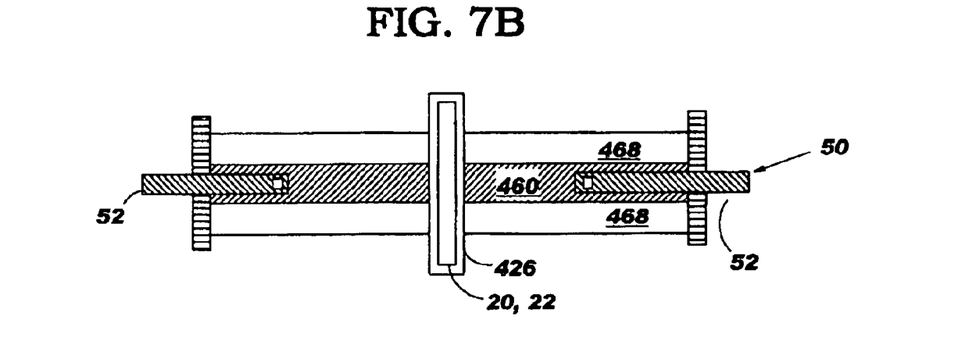
FIG. 7B shows a plan view of the interconnect of FIG. 7A.

FIGS. 7A and 7B illustrate a fifth embodiment in which chip guard ring 20, 22 includes a first type base 426. Connection portion 454 includes a second type well 460. In addition, a third type well 468 is provided to each side of second type well 460. The third type (e.g., epitaxial N−) is made of a lower concentration type of the second type (e.g., N). This embodiment provides a mechanism in which connection portion 454 is isolated from chip guard ring 20, 22 by first type base 426, but is isolated from other interconnects only by the resistance of the lower concentration (epitaxial N−) third type well 468.

The invention also includes an integrated circuit comprising: a second circuit section 14; a first circuit section 12 separated from the second circuit section; a first chip guard ring 22 surrounding the second circuit section; a second chip guard ring 20 surrounding the first circuit section; and at least one pair of interconnects 50 connecting the second circuit 14 and first circuit sections 12. Each interconnect 50 includes a connection section for each chip guard ring, which connects jumpers 52 on opposing sides of a respective chip guard ring 20, 22. The integrated circuit 10 may include a plurality of pairs of interconnects 50 where each pair of interconnects are electrically isolated from the other pairs of interconnects and respective chip guard rings.

While the particular embodiments of connection portions have been described above individually, it should be recognized that the various embodiments may be used together. For instance, as shown in FIG. 2, the structure of one interconnect (left side) may differ from the structure of another interconnect (right side) of the same pair of interconnects that are connecting first circuit and second circuit sections 12, 14.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A structure for isolating circuit sections of an integrated circuit, the circuit sections each having at least one differing characteristic, the structure comprising:
    a chip guard ring for each circuit section having the at least one differing characteristic.

2. The structure of claim 1, further comprising at least one interconnect for connectivity about a respective chip guard ring, each interconnect including a lead portion adjacent to each side of a respective chip guard ring and a connection portion connecting the lead portions.

3. The structure of claim 2, wherein the connection portion is separated from other structure by a pair of deep trenches.

4. The structure of claim 2, wherein the connection portion includes a first type well positioned below a second type base of the chip guard ring, and a pair of second type reachthroughs extending through the first type well and connected by a second type subcollector.

5. The structure of claim 2, wherein the chip guard ring includes at least one first type base portion and a second type base portion to each side of each first type base portion, and
    wherein the connection portion includes a second type well below each first type base portion and a pair of second type reachthroughs extending through the second type well and connected by a second type isolation.

6. The structure of claim 5, further comprising a first type well positioned to each side of the second type well and below each second type base portion.

7. The structure of claim 2, wherein the chip guard ring includes at least one first type base portion and a second type base portion to each side of each first type base portion; and
    wherein the connection portion includes a second type well positioned below each first type base portion and between a pair of first type wells.

8. The structure of claim 2, wherein the chip guard ring includes an oxide base, and the connection portion includes a well having a pair of different type wells to each side.

9. The structure of claim 2, wherein the chip guard ring includes a first type base, and the connection portion includes a second type well, and further comprising a third type well to each side of the second type well.

10. The structure of claim 9, wherein the third type is a lower concentration type of the second type.

11. An integrated circuit comprising:
    a first circuit section;
    a second circuit section having at least one different characteristic than the first circuit section;
    a first chip guard ring surrounding the first circuit section; and
    a second chip guard ring surrounding the second circuit section.

12. The integrated circuit of claim 11, further comprising at least one interconnect for connectivity about a respective chip guard ring, each interconnect including a lead portion adjacent to each side of a respective chip guard ring and a connection portion connecting the lead portions.

13. The integrated circuit of claim 11, wherein the connection portion includes a first type well positioned below a second type base of the chip guard ring, and a pair of second type reachthroughs extending through the first type well and connected by a second type isolation.

14. The integrated circuit of claim 11, wherein the chip guard ring includes at least one first type base portion and a second type base portion to each side of each first type base portion, and
    wherein the connection portion includes a second type well below each first type base portion and a pair of second type reachthroughs extending through the second type well and connected by a second type isolation.

15. The integrated circuit of claim 11, wherein the chip guard ring includes at least one first type base portion and a second type base portion to each side of each first type base portion; and
    wherein the connection portion includes a second type well positioned below the first type base portion and between a pair of first type wells.

16. The integrated circuit of claim 11, wherein the chip guard ring includes an oxide base, and the connection portion includes a well, and further comprising a different type well to each side of the well.

17. The integrated circuit of claim 11, wherein the chip guard ring includes a first type base, and the connection portion includes a second type well, and further comprising a third type well to each side of the second type well.

18. A structure for an integrated circuit having a chip guard ring, the structure comprising:
    at least one interconnect for electrical connectivity about and under the chip guard ring.

19. The structure of claim 18, wherein each interconnect includes a lead portion adjacent to each side of the chip guard ring and a connection portion connecting the lead portions.

20. The structure of claim 18, wherein the integrated circuit includes at least two chip guard rings, each chip guard ring surrounding a circuit section having at least one different characteristic than another circuit section.

* * * * *